(12) United States Patent
Shirafuji

(10) Patent No.: US 9,251,818 B2
(45) Date of Patent: Feb. 2, 2016

(54) SUSPENSION BOARD WITH CIRCUITS FOR ACCURATE POSTURE ANGLE ADJUSTMENT, AND METHOD FOR MANUFACTURING THE SAME

(71) Applicant: Nitto Denko Corporation, Ibaraki-shi, Osaka (JP)

(72) Inventor: Youhei Shirafuji, Ibaraki (JP)

(73) Assignee: NITTO DENKO CORPORATION, Ibaraki-shi, Osaka (JP)

( * ) Notice: Subject to any disclaimer, the term of this patent is extended or adjusted under 35 U.S.C. 154(b) by 11 days.

(21) Appl. No.: 14/134,516

(22) Filed: Dec. 19, 2013

(65) Prior Publication Data

US 2014/0177106 A1 Jun. 26, 2014

Related U.S. Application Data

(60) Provisional application No. 61/754,204, filed on Jan. 18, 2013.

(30) Foreign Application Priority Data

Dec. 26, 2012 (JP) ................................. 2012-283395

(51) Int. Cl.
  *G11B 21/21* (2006.01)
  *G11B 5/48* (2006.01)
  *H05K 1/02* (2006.01)
  *G11B 5/60* (2006.01)
  *H05K 1/05* (2006.01)
  *H05K 3/10* (2006.01)
  *H05K 3/28* (2006.01)

(52) U.S. Cl.
  CPC .............. *G11B 5/4853* (2013.01); *G11B 5/486* (2013.01); *H05K 1/0278* (2013.01); *H05K 1/056* (2013.01); *H05K 3/108* (2013.01); *H05K 3/28* (2013.01); *H05K 2201/0154* (2013.01); *H05K 2201/0191* (2013.01); *Y10T 29/49162* (2015.01)

(58) Field of Classification Search
  CPC ............................... G11B 5/486; G11B 5/4853
  USPC ......................... 360/245.8, 245.9, 246, 244.3
  See application file for complete search history.

(56) References Cited

U.S. PATENT DOCUMENTS

| 6,673,256 B2 * | 1/2004 | Takasugi .................... 360/244.3 |
| 6,900,967 B1 * | 5/2005 | Coon et al. ................. 360/245.9 |
| 2011/0317312 A1 | 12/2011 | Yamaguchi |

FOREIGN PATENT DOCUMENTS

| JP | 2002-158411 A | 5/2002 |
| JP | 2012-009111 A | 1/2012 |

* cited by examiner

*Primary Examiner* — Craig A. Renner
(74) *Attorney, Agent, or Firm* — Panitch Schwarze Belisario & Nadel LLP

(57) ABSTRACT

A thick portion having a first thickness and a thin portion having a second thickness on a base insulating layer are formed on a conductive support substrate. The second thickness is smaller than the first thickness. A boundary surface is formed between an upper surface of the thick portion and an upper surface of the thin portion. A boundary line between the upper surface of the thick portion and the boundary surface extends in a first direction. Write wiring traces and read wiring traces are formed to extend on the thick portion and the thin portion of the base insulating layer. The lateral sides of the write wiring traces and the read wiring traces extend in a second direction that intersects with the first direction, and the second direction forms an angle of not less than 60 degrees and not more than 90 degrees with the first direction.

10 Claims, 17 Drawing Sheets

FIG. 5 (a)
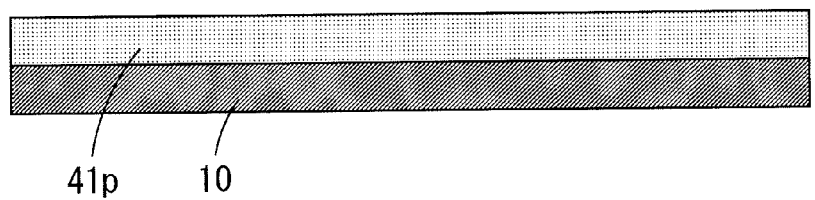
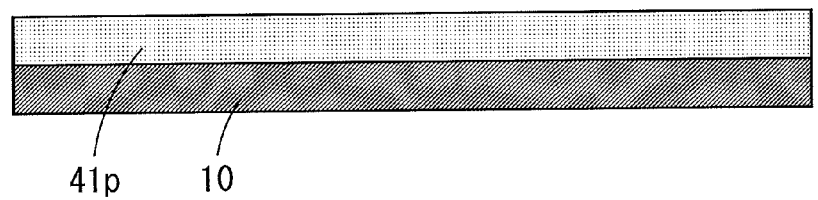
FIG. 5 (b)
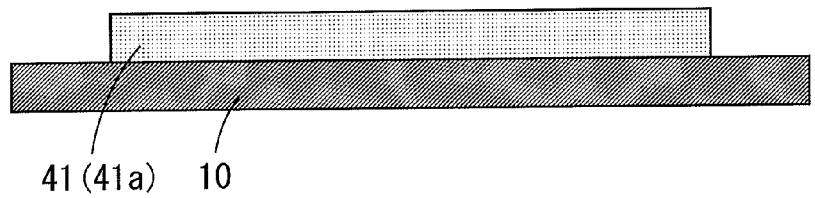
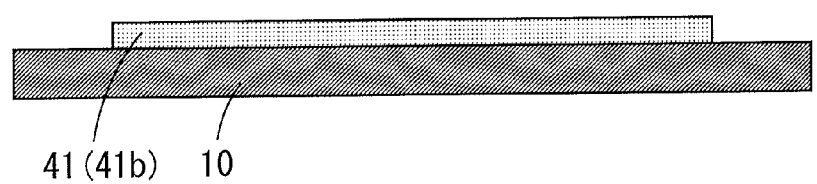

FIG. 6 (a)
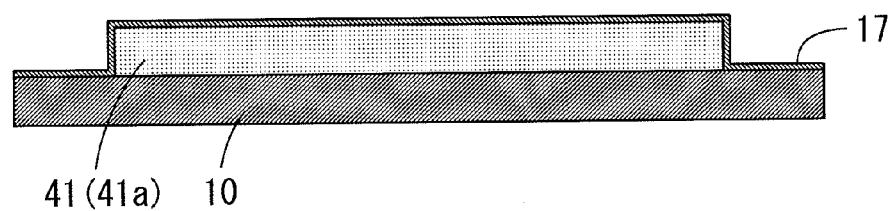
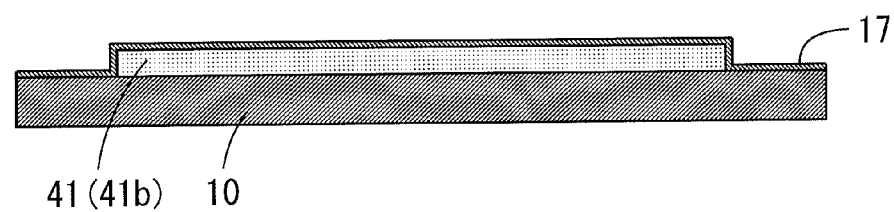
FIG. 6 (b)
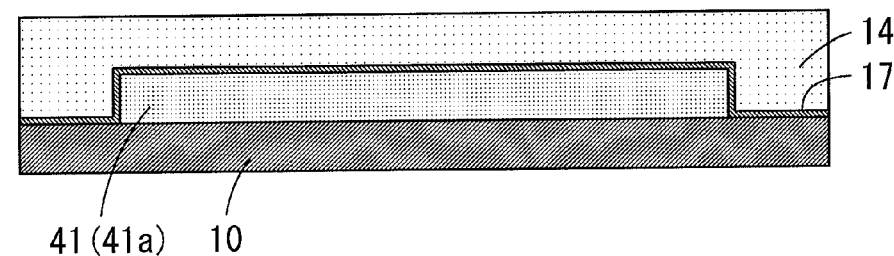
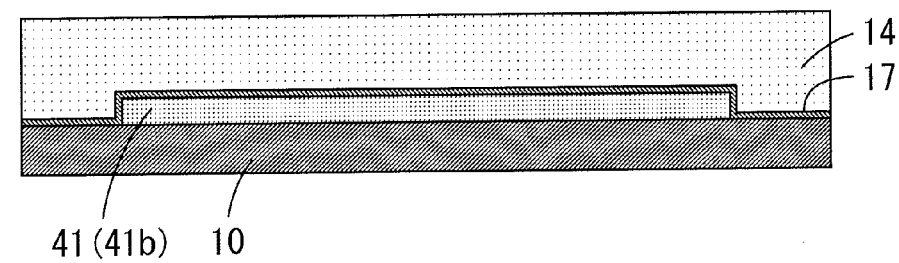

FIG. 9 (a)
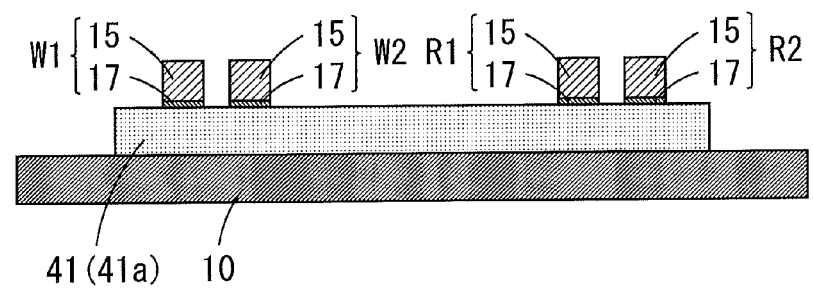
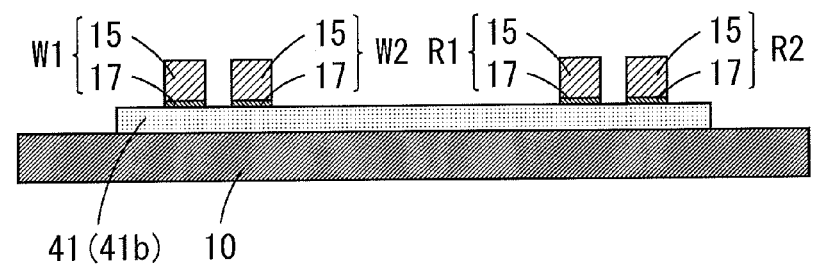
FIG. 9 (b)
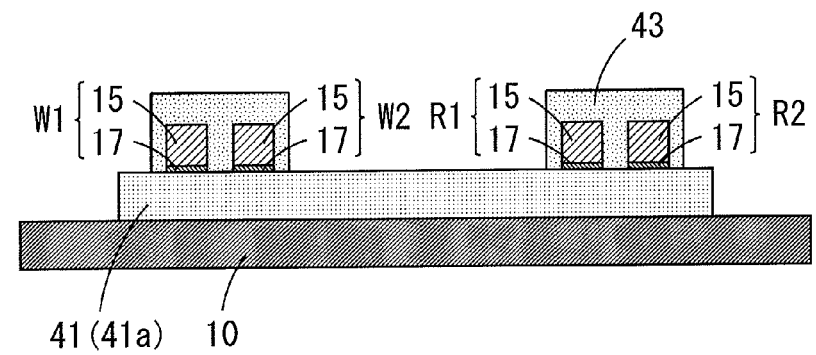
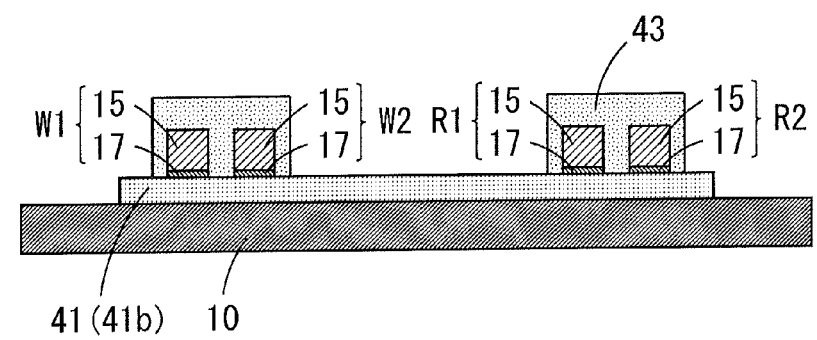

F I G. 1 2 (a)
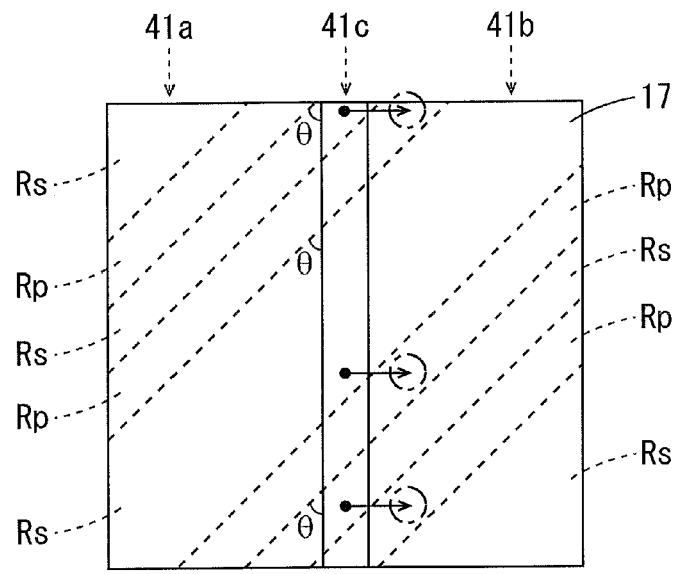
F I G. 1 2 (b)
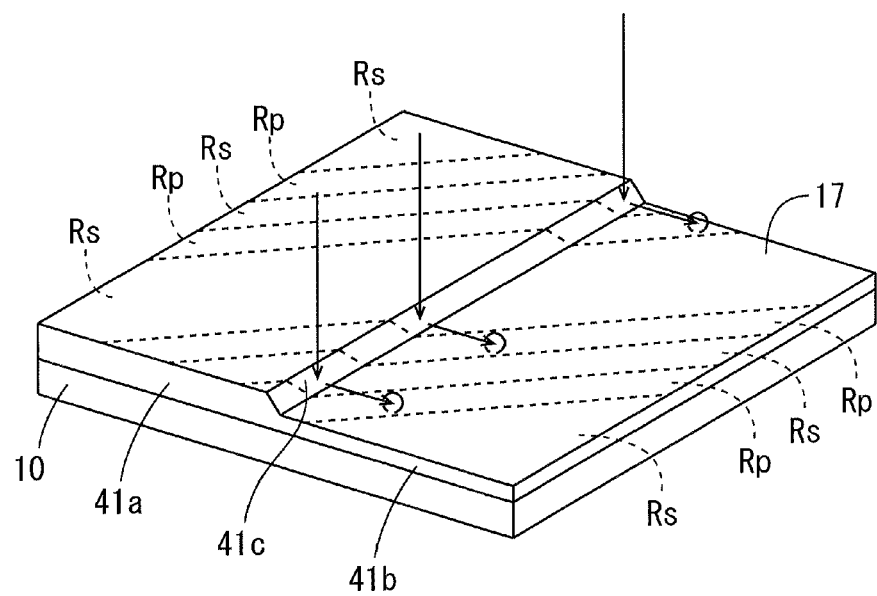

FIG. 16 (a) θ=90°
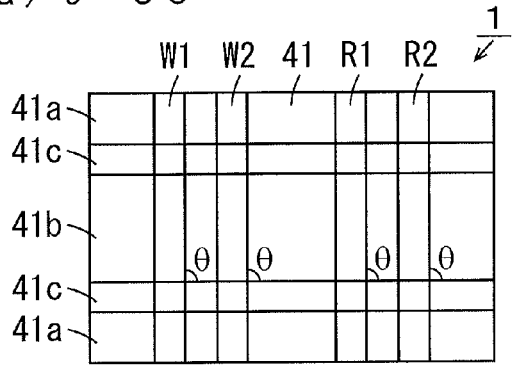
FIG. 16 (b) θ=80°
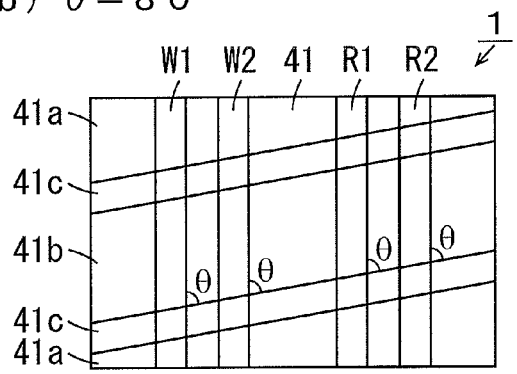
FIG. 16 (c) θ=70°
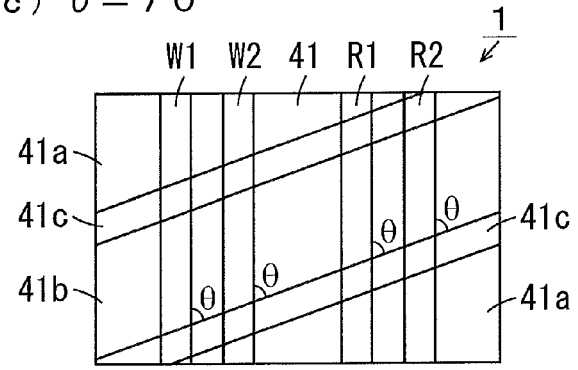
FIG. 16 (d) θ=60°
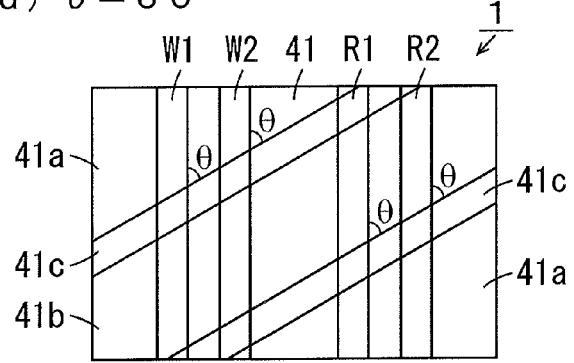

FIG. 17 (a) θ=50°
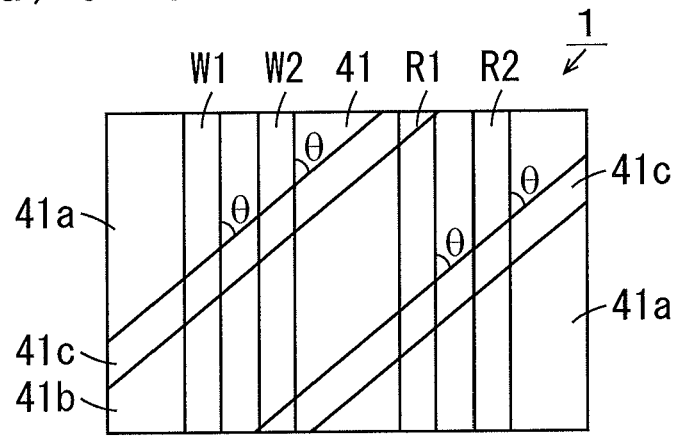
FIG. 17 (b) θ=40°
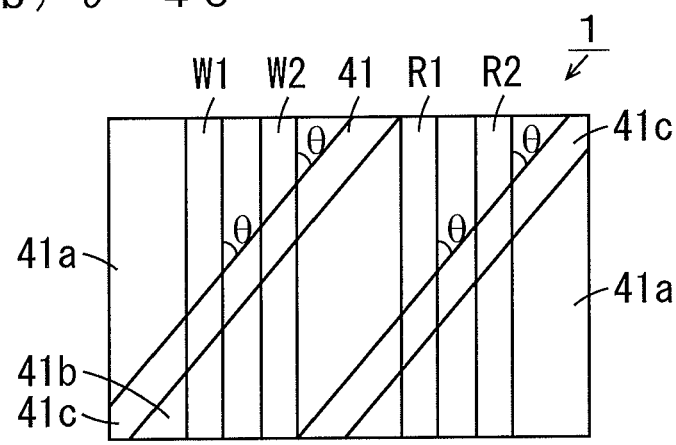
FIG. 17 (c) θ=30°
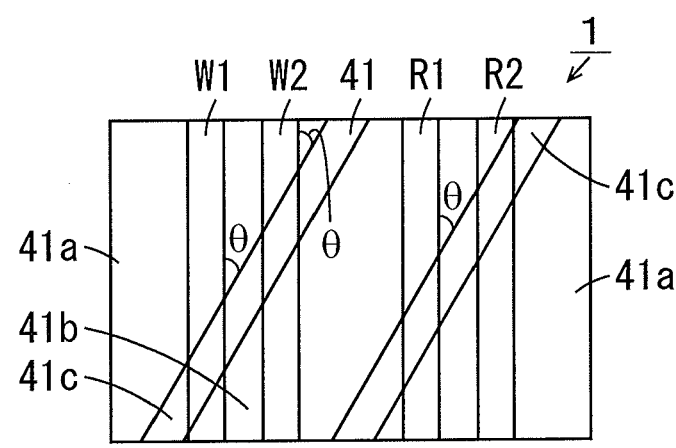

SUSPENSION BOARD WITH CIRCUITS FOR ACCURATE POSTURE ANGLE ADJUSTMENT, AND METHOD FOR MANUFACTURING THE SAME

BACKGROUND OF THE INVENTION

1. Field of the Invention

The present invention relates to a suspension board with circuits and a method for manufacturing the suspension board with circuits.

2. Description of Related Art

Actuators are used in drives such as hard disc drives. Such an actuator includes an arm provided rotatably around a rotation shaft, and a suspension board for a magnetic head that is attached to the arm. The suspension board with circuits is a printed circuit board for positioning the magnetic head at a desired track of a magnetic disc.

JP 2012-9111 A describes a flexure that includes a metal substrate for supporting a slider, a base insulating layer formed on the metal substrate, and a wiring formed on the base insulating layer. The wiring is connected to the slider. Signals of recording and reproduction are transmitted to the slider through the wiring.

BRIEF SUMMARY OF THE INVENTION

A clearance is formed at a portion of the metal substrate in the flexure described in JP 2012-9111 A. Further, a portion of the base insulating layer that overlaps with the clearance is formed to be thinner than other portions of the base insulating layer in order to reduce the rigidity contribution ratio of the wiring. However, if a wiring trace is formed on the base insulating layer having inconstant thicknesses, a deficiency such as a disconnection or a short-circuit may occur at the wiring trace.

An object of the present invention is to provide a suspension board with circuits that can adjust a posture angle with a high degree of accuracy while ensuring reliability of a wiring trace, and a method for manufacturing the suspension board with circuits.

(1) According to one aspect of the present invention, a suspension board with circuits includes a support substrate formed of a conductive material, an insulating layer that is formed on the support substrate, and includes a first portion having a first thickness and a second portion having a second thickness smaller than the first thickness, and a wiring trace formed to extend on the first portion and the second portion of the insulating layer, wherein a boundary surface is formed between an upper surface of the first portion and an upper surface of the second portion, a boundary line between the upper surface of the first portion and the boundary surface extends in a first direction, and a lateral side of the wiring trace extends in a second direction that intersects with the first direction, and the wiring trace is formed on an upper surface of the insulating layer such that the second direction forms an angle of not less than 60 degrees and not more than 90 degrees with the first direction.

In this suspension board with circuits, the first portion having the first thickness and the second portion having the second thickness are formed at the insulating layer on the conductive support substrate. Thus, flexibility at a specific portion of the suspension board with circuits can be improved, and rigidity of the suspension board with circuits can be controlled.

The boundary surface is formed between the upper surface of the first portion and the upper surface of the second portion. Therefore, in the process of forming the wiring trace on the insulating layer by the photolithographic technique, reflection of the exposure light occurs at the boundary surface, and another region is indirectly irradiated with the reflected light.

According to the above-mentioned configuration, the boundary line between the upper surface of the first portion and the boundary surface extends in the first direction, the lateral side of the wiring trace extends in the second direction that intersects with the first direction and the second direction forms an angle of not less than 60 degrees and not more than 90 degrees with the first direction. In this case, the exposure light is reflected at the boundary surface in a direction that forms a smaller angle with respect to a direction in which the wiring trace extends. Therefore, the reflected light hardly influences the original pattern of the exposure light. Thus, a deficiency such as a disconnection or a short-circuit is prevented from occurring at the wiring trace that is formed using the photolithographic technique.

As a result, the posture angle of the suspension board with circuits can be adjusted with a high degree of accuracy while reliability of the wiring trace is ensured.

(2) The wiring trace may be formed on the upper surface of the insulating layer such that the second direction forms an angle of 90 degrees with the first direction.

In this case, the exposure light is reflected at the boundary surface in a direction substantially parallel to a direction in which the wiring trace extends. Therefore, the reflected light at the boundary surface does not influence the original pattern of the exposure light. Thus, a deficiency such as a disconnection or a short-circuit is sufficiently prevented from occurring at the wiring trace that is formed using the photolithographic technique.

(3) The boundary surface may be inclined by an angle larger than 0 degree and smaller than 90 degrees with respect to an upper surface of the second portion of the insulating layer.

In a case in which the first and second portions are formed such that the boundary surface forms an angle of 90 degrees with the upper surface of the second portion, although the reflected light at the boundary surface is reduced, the procedure for forming the first portion and the second portion at the insulating layer is extremely complicated. Further, stress is easily concentrated in the vicinity of the boundary line between the second portion and the boundary surface at the time of bending.

In contrast, because the configuration of the present invention causes the reflected light at the boundary surface to hardly influence the original pattern of the exposure light, even if the boundary surface is inclined with respect to the upper surface of the second portion, a deficiency due to the reflected light is prevented from occurring at the wiring trace that is formed using the photolithographic technique. Therefore, the boundary surface is inclined with respect to the upper surface of the second portion, whereby the first portion and the second portion can be easily formed at the insulating layer and concentration of the stress in the vicinity of the boundary line between the boundary surface and the second portion can be retrieved.

(4) The insulating layer may alternately include the plurality of first portions and more than the one second portion in the second direction.

In this case, flexibility at a specific portion in a direction in which the wiring trace of the suspension board with circuits extends can be improved, and rigidity of the suspension board with circuits can be controlled. Thus, the posture angle of the suspension board with circuits can be adjusted with a high degree of accuracy in a direction in which the wiring trace extends.

(5) The first portion may have a thickness of not less than 3 μm and not more than 20 μm, and the second portion may have a thickness of not less than 2 μm and not more than 15 μm.

In this case, flexibility at a specific portion of the suspension board with circuits can be sufficiently improved, and rigidity of the suspension board with circuits can be controlled. Thus, the posture angle of the suspension board with circuits can be adjusted with a high degree of accuracy.

(6) The insulating layer may include a lower insulating layer that is formed on the support substrate, and has the second thickness and an upper insulating layer formed in a partial region of an upper surface of the lower insulating layer, and a portion of the lower insulating layer in the partial region and the upper insulating layer form the first portion, and a portion of the lower insulating layer in a region except for the partial region forms the second portion of the insulating layer.

In this case, the lower insulating layer and the upper insulating layer are sequentially formed on the support substrate, whereby the first portion and the second portion can be easily formed at the insulating layer.

(7) According to another aspect of the present invention, a method for manufacturing a suspension board with circuits includes the steps of preparing a base material that has a laminated structure of a conductive support substrate and an insulating layer, forming a first portion having a first thickness and a second portion having a second thickness smaller than the first thickness at the insulating layer by processing the insulating layer, and forming a wiring trace that extends on the first portion and the second portion of the insulating layer, wherein a boundary surface is formed between an upper surface of the first portion and an upper surface of the second portion, and the step of forming the wiring trace includes forming the wiring trace on an upper surface of the insulating layer such that a boundary line between an upper surface of the first portion and the boundary surface extends in a first direction, a lateral side of the wiring trace extends in a second direction that intersects with the first direction, and the second direction forms an angle of not less than 60 degrees and not more than 90 degrees with the first direction.

In the method for manufacturing this suspension board with circuits, the first portion having the first thickness and the second portion having the second thickness are formed at the insulating layer on the conductive support substrate. Thus, flexibility at a specific portion of the suspension board with circuits can be improved, and rigidity of the suspension board with circuits can be controlled.

The boundary surface is formed between the upper surface of the first portion and the upper surface of the second portion. Therefore, in the process of forming the wiring trace on the insulating layer using the photolithographic technique, reflection of the exposure light occurs at the boundary surface, and another region is indirectly irradiated with the reflected light.

According to the above-mentioned configuration, the boundary line between the upper surface of the first portion and the boundary surface extends in the first direction, and the lateral side of the wiring trace extends in the second direction that intersects with the first direction and the second direction forms an angle of not less than 60 degrees and not more than 90 degrees with the first direction. In this case, the exposure light is reflected at the boundary surface in a direction that forms a smaller angle with respect to a direction in which the wiring trace extends. Therefore, the reflected light hardly influences the original pattern of the exposure light. Thus, a deficiency such as a disconnection or a short-circuit is prevented from occurring at the wiring trace that is formed using the photolithographic technique.

As a result, the posture angle of the suspension board with circuits can be adjusted with a high degree of accuracy while reliability of the wiring trace is ensured.

(8) The step of forming the wiring trace on the first and second portions of the insulating layer may include forming a resist film on the insulating layer, irradiating the resist film with an exposure light having a predetermined pattern, forming a resist pattern by developing the resist film, forming the wiring trace in a region of the insulating layer except for the resist pattern, and removing the resist pattern.

In this case, the exposure light is reflected at the boundary surface in a direction that forms a smaller angle with respect to a direction in which the wiring trace extends. Therefore, the reflected light hardly influences the original pattern of the exposure light with which the resist film is irradiated. Therefore, the resist pattern can be formed with a high degree of accuracy. As a result, the wiring trace can be formed with a high degree of accuracy at the first and second portions having different thicknesses.

(9) An accumulated amount of the exposure light with which the resist film is irradiated may be not less than 50 mJ/cm² and not more than 1500 mJ/cm².

In this case, because the reflected light at the boundary surface hardly influences the original pattern of the exposure light, the resist pattern can be formed with a high degree of accuracy at the first and second portions having different thicknesses. Further, resolution of the exposure light can be improved, and the resist film can be sufficiently exposed. Further, dimensional accuracy of the resist pattern can be improved.

(10) A wavelength of the exposure light with which the resist film is irradiated may be not less than 300 nm and not more than 450 nm. In this case, because the reflected light at the boundary surface hardly influences the original pattern of the exposure light, the wiring trace having a small width can be formed at the first and second portions having different thicknesses.

The present invention enables the posture angle of the suspension board with circuits to be adjusted with a high degree of accuracy while reliability of the wiring trace is ensured.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIGS. 5(a) and 5(b) are sectional views for use in illustrating steps in a method of manufacturing the suspension board of FIG. 1;

FIGS. 6(a) and 6(b) are sectional views for use in illustrating steps in a method of manufacturing the suspension board of FIG. 1;

FIGS. 9(a) and 9(b) are sectional views for use in illustrating steps in a method of manufacturing the suspension board of FIG. 1;

FIGS. 12(a) and 12(b) are sectional views for use in illustrating steps in a method of manufacturing the suspension board when an intersection angle is set to 45°;

FIGS. 16(a) to 16(d) are plan views showing part of the suspension board according to the inventive examples 1 to 4; and FIGS. 17(a) to 17(c) are plan views showing part of the suspension board according to the comparative examples 1 to 3.

DESCRIPTION OF THE PREFERRED EMBODIMENTS

A suspension board with circuits and a method for manufacturing the suspension board with circuits according to the embodiments of the present invention will be described below with reference to the drawings. Configuration and a method for manufacturing the suspension board with circuits (hereinafter referred to as a suspension board) used for an actuator in a hard disc drive will be described as an example of the suspension board with circuits according to the embodiments of the present invention.

(1) Configuration of Suspension Board

Figure 1:
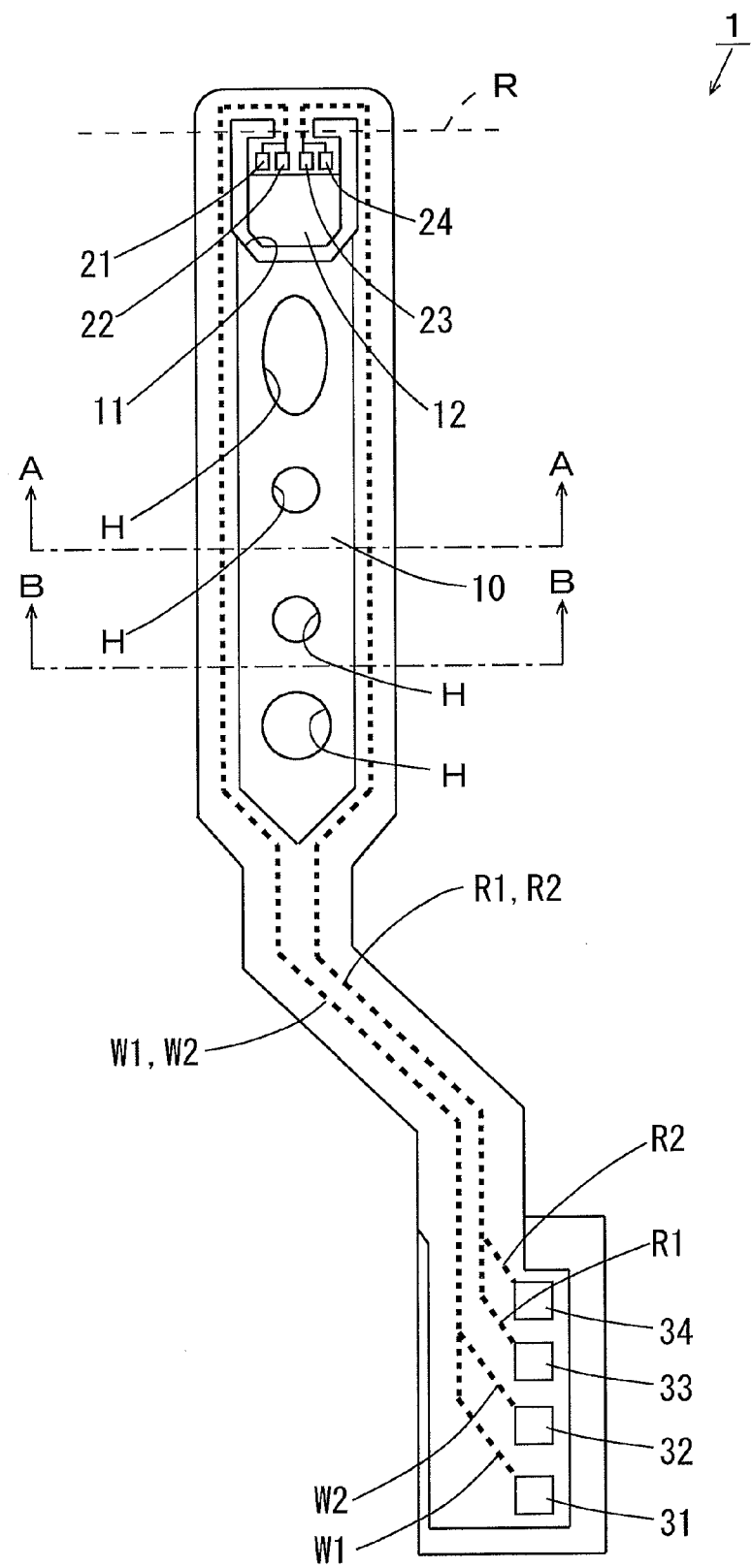
FIG. 1 is a top view of a suspension board according to one embodiment of the present invention.

FIG. 1 is a top view of the suspension board according to the one embodiment of the present invention. As shown in FIG. 1, the suspension board 1 includes a support substrate 10 formed of a conductive material such as stainless, for example. A pair of linear write wiring traces W1, W2 and a pair of linear read wiring traces R1, R2 are formed on the support substrate 10. In FIG. 1, the pair of write wiring traces W1, W2 and the pair of read wiring traces R1, R2 are indicated by the thick dotted line.

At one end (a tip) of the support substrate 10, a magnetic head supporting portion (hereinafter referred to as a tongue) 12 is provided by forming a U-shaped opening 11. The tongue 12 is bent along a broken line R to form a predetermined angle with the support substrate 10. Four electrode pads 21, 22, 23, 24 are formed at the end of the tongue 12. Four electrode pads 31, 32, 33, 34 are formed at the other end of the support substrate 10.

The electrode pads 21, 22 on the tongue 12 and the electrode pads 31, 32 on the other end of the support substrate 10 are electrically connected by the write wiring traces W1, W2, respectively. Further, the electrode pads 23, 24 on the tongue 12 and the electrode pads 33, 34 at the other end of the support substrate 10 are electrically connected by the read wiring traces R1, R2, respectively. Further, a plurality of holes H are formed at the support substrate 10.

In a hard disc device (not shown) that includes the suspension board 1, an electric current flows through the pair of the write wiring traces W1, W2 at the time of writing information into a magnetic disc. Further, the electric current flows through the pair of the read wiring traces R1, R2 at the time of reading information from the magnetic disc.

Figure 2:
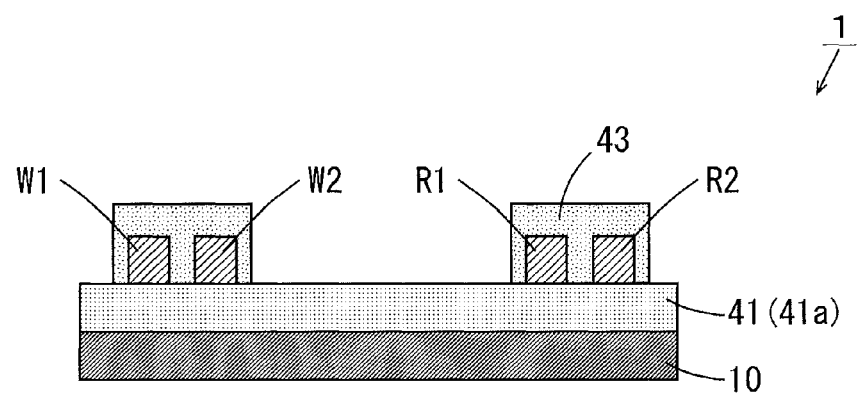
FIGS. 2(a) and 2(b) are cross sectional views of the suspension board of FIG. 1.
Figure 2:
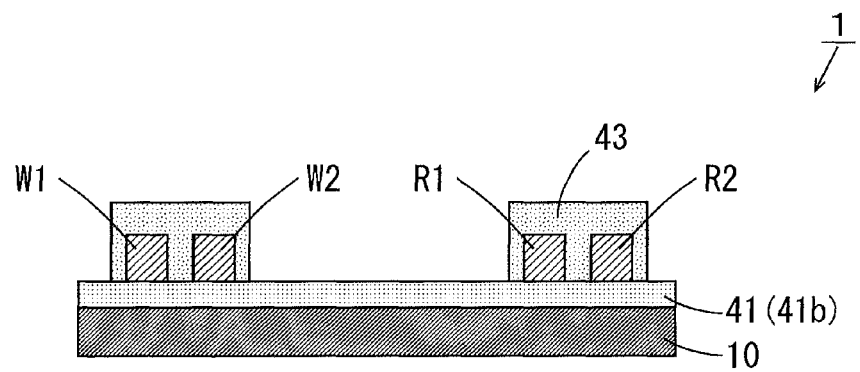
Figure 3:
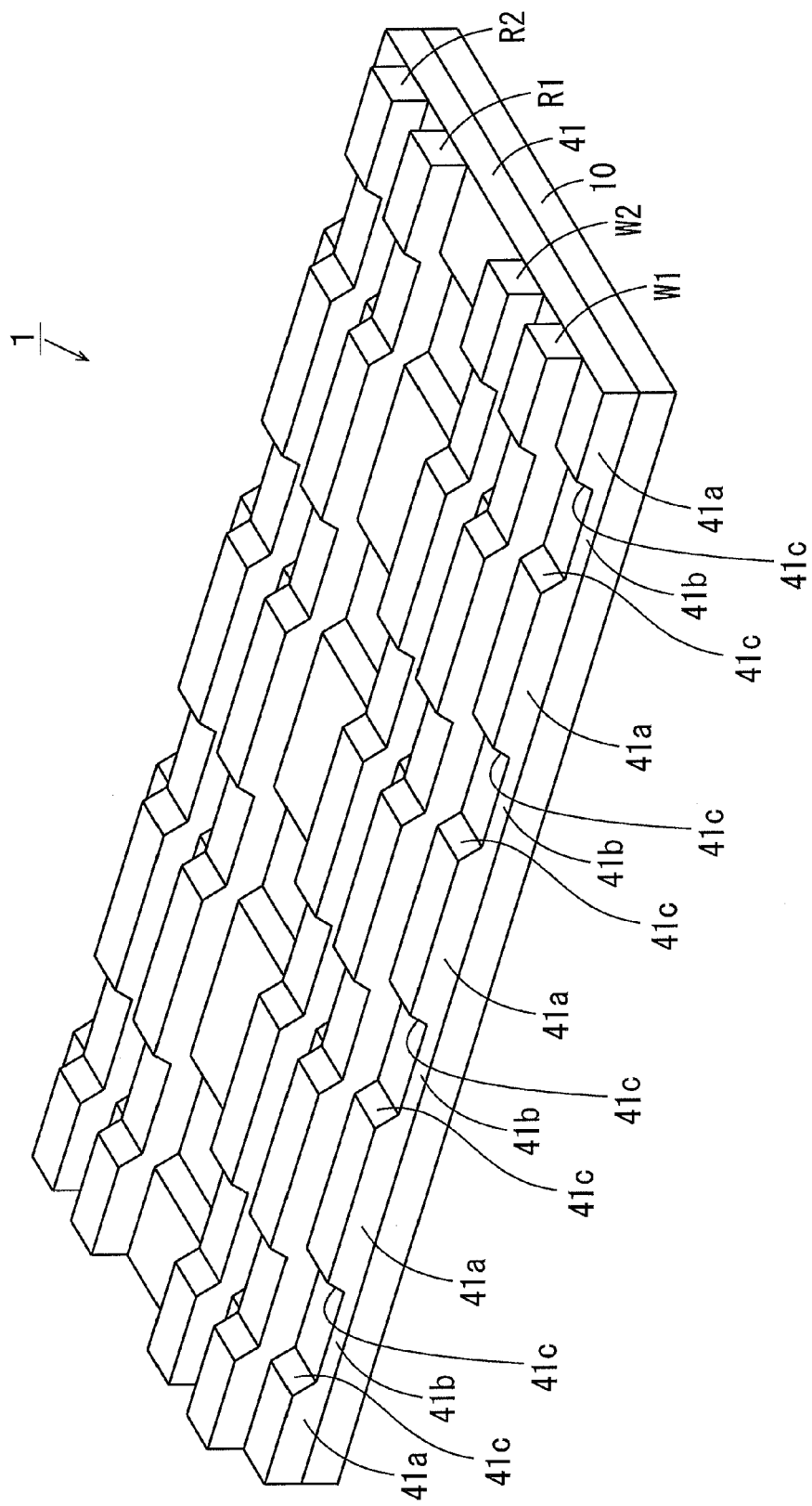
FIG. 3 is a partial schematic perspective view of the suspension board of FIG. 1.
Figure 4:
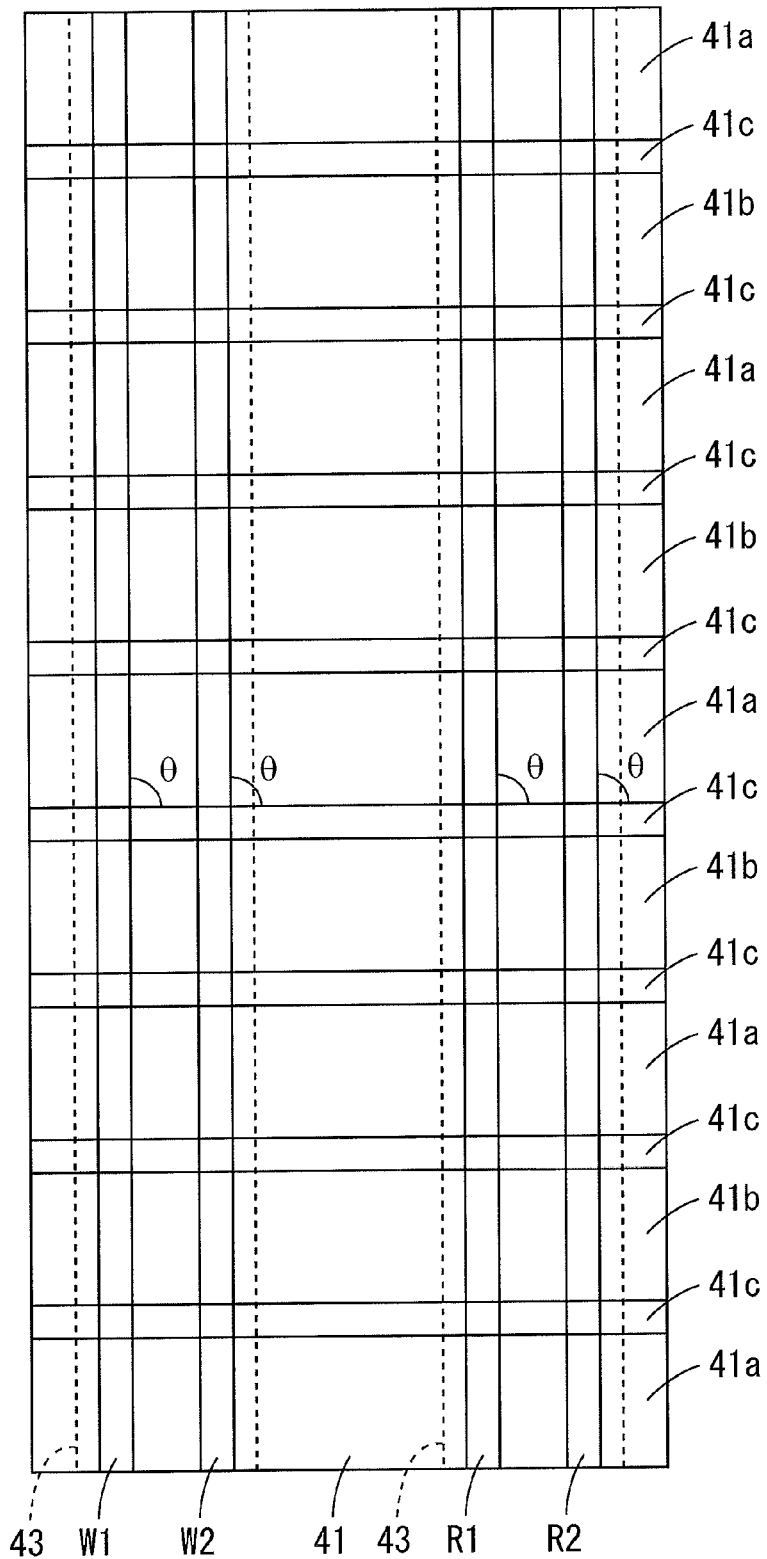
FIG. 4 is a partial plan view of the suspension board of FIG. 1.

Next, the write wiring traces W1, W2 and the read wiring traces R1, R2 of the suspension board 1, and their peripheries will be described in detail. FIGS. 2(a) and 2(b) are cross sectional views of the suspension board 1 of FIG. 1. FIG. 3 is a partial schematic perspective view of the suspension board 1 of FIG. 1. FIG. 4 is a plan view of a portion of the suspension board 1 of FIG. 1. FIG. 2(a) shows a cross sectional view taken along the line A-A of FIG. 1, and the FIG. 2(b) shows a cross sectional view taken along the line B-B of FIG. 1.

As shown in FIGS. 2(a), 2(b) and 3, a base insulating layer 41 made of polyimide, for example, is formed on the support substrate 10. The base insulating layer 41 includes a thick portion 41a and a thin portion 41b. In the present embodiment, the base insulating layer 41 is formed on the support substrate 10 such that the thick portion 41a and the thin portion 41b are alternately arranged. As shown in FIGS. 2(a) and 2(b), the thin portion 41b has a smaller thickness than that of the thick portion 41a. As shown in FIGS. 3 and 4, the upper surface of each thick portion 41a and the upper surface of each thin portion 41b of the base insulating layer 41 are referred to as a boundary surface 41c. The boundary surface 41c is larger than 0° and smaller than 90° with respect to each upper surface of the thick portion 41a and the thin portion 41b.

Each boundary surface 41c extends in a strip shape in one direction. The plurality of boundary surfaces 41c may extend in different directions. In the present embodiment, each boundary surface 41c has a constant width. In a case in which the upper surface of the thick portion 41a and the upper surface of the thin portion 41b are not parallel to each other, that is, in a case in which the thickness of the thick portion 41a and the thickness of the thin portion 41b are not constant, the width of each boundary surface 41 changes.

The write wiring traces W1, W2 having the constant width and the read wiring traces R1, R2 having the constant width are formed on the base insulating layer 41 in parallel to each other with a distance therebetween. Here, the write wiring traces W1, W2 and the read wiring traces R1, R2 are formed on the base insulating layer 41 to intersect with the boundary surface 41c between the thick portion 41a and the thin portion 41b by a predetermined angle.

Hereinafter, an angle that is formed by the write wiring traces W1, W2 and the read wiring traces R1, R2 with the boundary line between the thick portion 41a and the boundary surface 41c is referred to as an intersection angle θ. In the present embodiment, an angle that is formed by the write wiring traces W1, W2 and the read wiring traces R1, R2 with the boundary surface 41c is the intersection angle θ. The intersection angle θ is set to not less than 60° and not more than 90°. In the present embodiment, the intersection angle θ is 90°.

The write wiring trace W1 and the write wiring trace W2 constitute a signal line pair. Further, the read wiring trace R1 and the read wiring trace R2 constitute a signal line pair. A cover insulating layer 43 made of polyimide, for example, is formed on the base insulating layer 41 to cover the write wiring traces W1, W2 and the read wiring traces R1, R2. In FIG. 3, the cover insulating layer 43 is not shown. In FIG. 4, the cover insulating layer 43 is indicated by the dotted line.

(2) Method for Manufacturing Suspension Board

Figure 10:
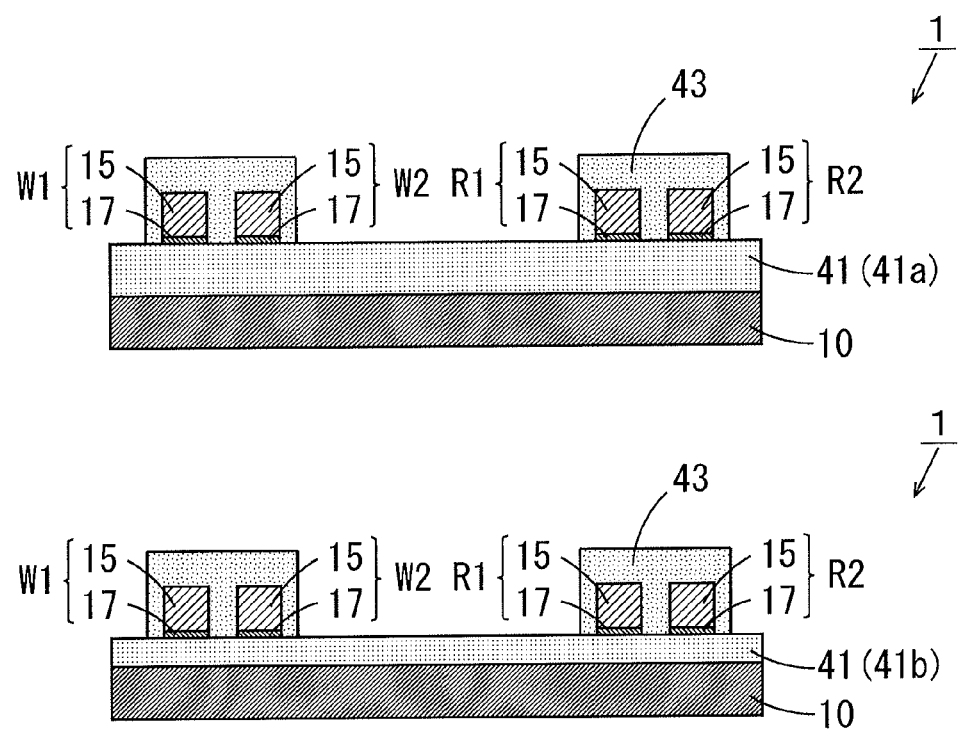
FIG. 10 is a sectional view for use in illustrating steps in a method of manufacturing the suspension board of FIG. 1.

The process for manufacturing the suspension board 1 of FIG. 1 will be described. FIGS. 5 to 10 are sectional views for use in illustrating steps in a method for manufacturing the suspension board 1 of FIG. 1. The upper diagrams in FIGS. 5(*a*), 5(*b*) to 9(*a*), 9(*b*), and the upper diagram in FIG. 10 show cross sectional views taken along the line A-A of the suspension board 1 of FIG. 1. The lower diagrams in FIGS. 5(*a*), 5(*b*) to 9(*a*), 9(*b*) and the lower diagram in FIG. 10 show cross sectional views taken along the line B-B of the suspension board 1 of FIG. 1.

First, as shown in FIG. 5(*a*), a photosensitive polyimide resin precursor 41*p* is applied on the long-sized support substrate 10 made of stainless steel, for example. The support substrate 10 preferably has a thickness of not less than 10 µm and not more than 60 µm, and more preferably has a thickness of not less than 12 µm and not more than 55 µm.

Next, as shown in FIG. 5(*b*), the photosensitive polyimide resin precursor 41*p* on the support substrate 10 is irradiated with ultraviolet rays of not less than 200 mJ/cm$^2$ and not more than 700 mJ/cm$^2$ through a mask having a predetermined scale in an exposure device. Thus, the base insulating layer 41 made of polyimide is formed. The base insulating layer 41 has the thick portion 41*a* and the thin portion 41*b*.

The thick portion 41*a* preferably has a thickness of not less than 3 µm and not more than 20 µm, and more preferably has a thickness of not less than 4 µm and not more than 18 µm. Further, the thick portion 41*b* preferably has a thickness of not less than 2 µm and not more than 15 µm, and more preferably has a thickness of not less than 3 µm and not more than 14 µm.

Difference between the thickness of the thick portion 41*a* and that of the thin portion 41*b* is preferably more than 0 µm, and not less than 0.1 µm and not more than 18 µm, and is more preferably not less than 0.1 µm and not more than 14 µm. Thus, flexibility and rigidity of the suspension board 1 can be appropriately controlled. As a result, a PSA (a posture angle) of the magnetic head loaded on the suspension board 1 can be adjusted with a high degree of accuracy.

Thereafter, as shown in FIG. 6(*a*), a seed layer 17 is formed on the support substrate 10 and the base insulating layer 41. A chromium film having a thickness of not less than 10 nm and not more than 60 nm, for example, and a copper plating base having a thickness of not less than 50 nm and not more than 200 nm and a seat resistance of not more than 0.6 Ω/□, for example, are sequentially formed by successive spattering of chromium and copper, whereby formation of the seed layer 17 is performed.

Figure 7:
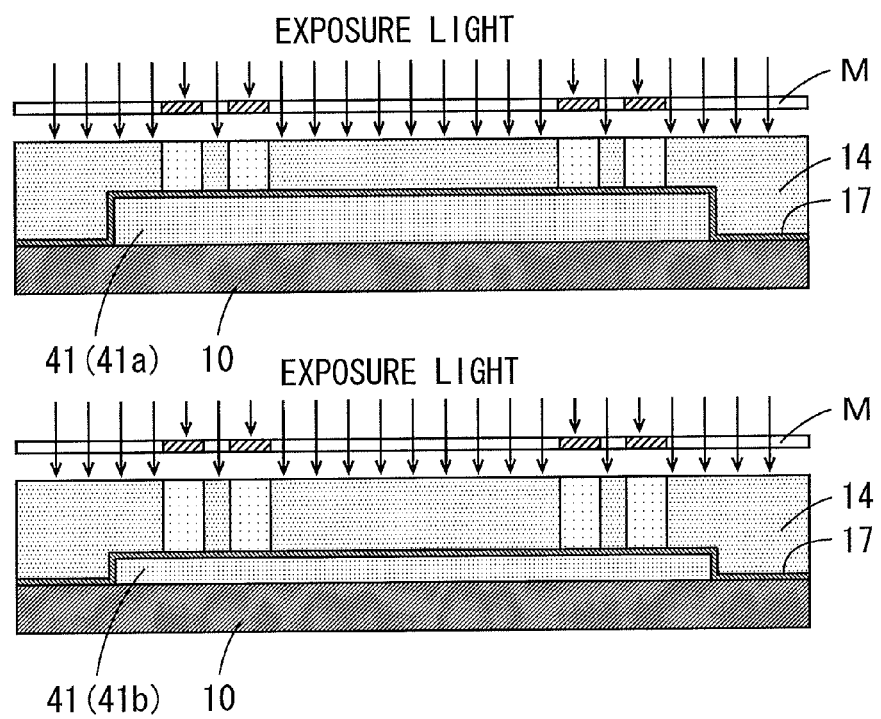
FIGS. 7(a) and 7(b) are sectional views for use in illustrating steps in a method of manufacturing the suspension board of FIG. 1.
Figure 7:
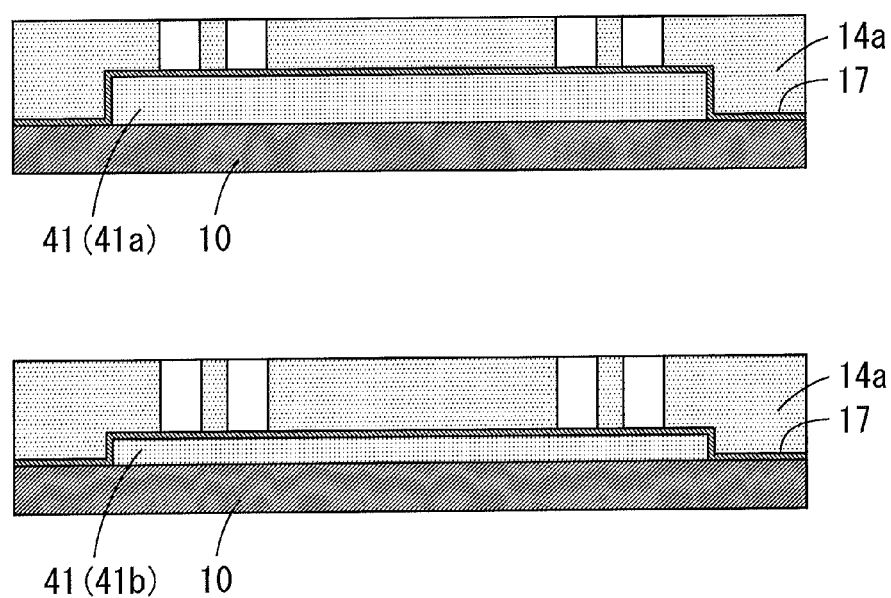

Next, as shown in FIG. 6(*b*), a resist film 14 for plating is formed on the seed layer 17 by a photosensitive dry film resist, for example. Subsequently, as shown in FIG. 7(*a*), the resist film 14 is irradiated with exposure light through a mask M having a predetermined pattern, whereby the resist film 14 is exposed.

Here, when the resist film 14 has negative photosensitivity, the resist film 14 is irradiated with the exposure light through the mask M having the same shape as the write wiring traces W1, W2 and the read wiring traces R1, R2 to be formed. On the other hand, when the resist film 14 has positive photosensitivity, the resist film 14 is irradiated with the exposure light through the mask M having an inverse shape of the write wiring traces W1, W2 and the read wiring traces R1, R2 to be formed. In the present example, the resist film 14 has the negative photosensitivity.

The exposure light preferably has a wavelength of not less than 300 nm and not more than 450 nm, and more preferably has a wavelength of not less than 350 nm and not less than 420 nm. The accumulated amount of the exposure light is preferably not less than 50 mJ/cm$^2$ and not more than 1500 mJ/cm$^2$, and is more preferably not less than 50 mJ/cm$^2$ and not more than 500 mJ/cm$^2$.

Thus, an etching resist pattern 14*a* can be formed with a high degree of accuracy at the thick portion 41*a* and the thin portion 41*b* that have different thicknesses. Further, the write wiring traces W1, W2 and the read wiring traces R1, R2 that have a small width can be formed.

Further, if the accumulated amount of the exposure light is not less than 50 mJ/cm$^2$, the resist film 14 can be sufficiently exposed and the thickness of the etching resist pattern 14*a* to be formed in the next process can be sufficiently increased. Further, exposure resolution of the resist film 14 can be improved. If the accumulated amount of the exposure light is not more than 1500 mJ/cm$^2$, the pattern width of the etching resist pattern 14*a* to be formed in the next process can be reduced.

Thereafter, as shown in FIG. 7(*b*), the resist film 14 is developed such that the etching resist pattern 14*a* is formed. The etching resist pattern 14*a* preferably has a thickness of not less than 3 µm and not more than 70 µm, and more preferably has a thickness of not less than 4 µm and not more than 65 µm.

Figure 8:
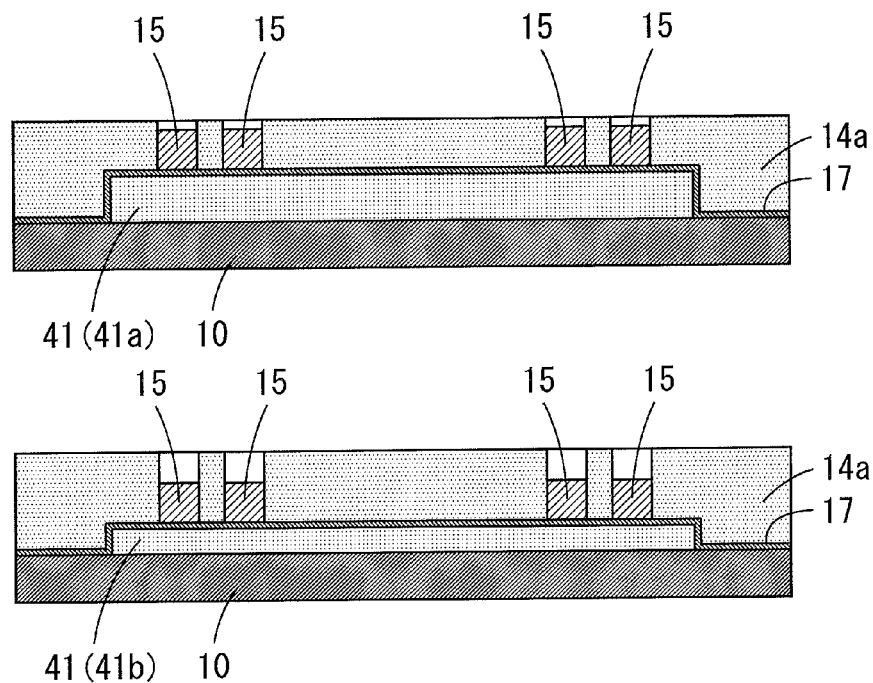
FIGS. 8(a) and 8(b) are sectional views for use in illustrating steps in a method of manufacturing the suspension board of FIG. 1.
Figure 8:
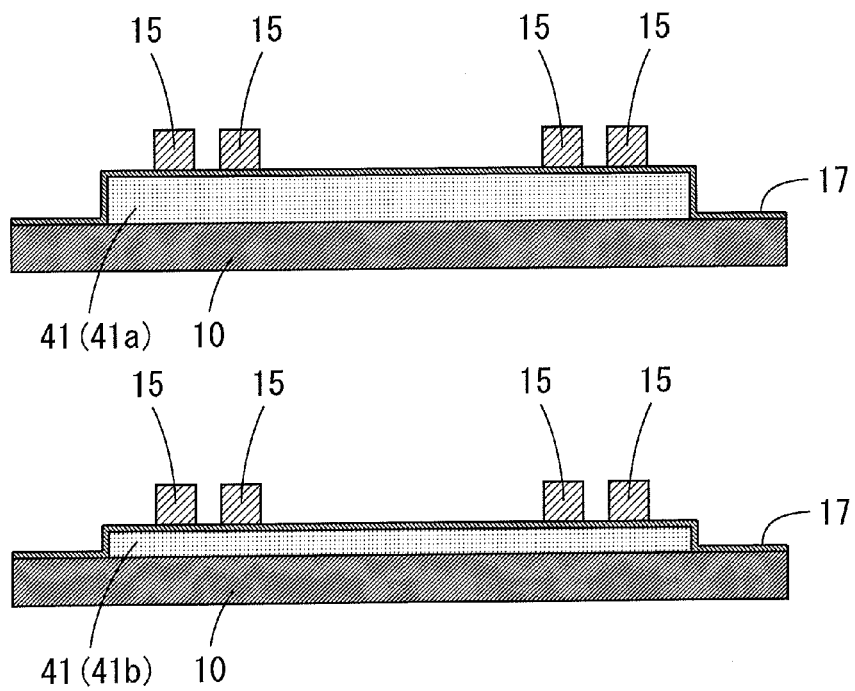

Next, as shown in FIG. 8(*a*), a copper plating layer 15 is formed on the seed layer 17 that is exposed from the etching resist pattern 14*a* by electrolytic plating of copper. Subsequently, as shown in FIG. 8(*b*), the etching resist pattern 14*a* is removed. Thereafter, as shown in FIG. 9(*a*), a portion of the seed layer 17 exposed from the copper plating layer 15 is removed by etching using an alkaline processing liquid.

Here, the write wiring traces W1, W2 and the read wiring traces R1, R2 are formed by the seed layer 17 and the copper plating layer 15 that remain on the base insulating layer 41. Each of the write wiring traces W1, W2 and the read wiring traces R1, R2 preferably has a thickness of not less than 1 µm and not more than 20 µm, and more preferably has a thickness of not less than 2 µm and not more than 18 µm.

Further, a distance between the write wiring traces W1, W2 and a distance between the read wiring traces R1, R2 are preferably respectively not less than 8 µm and not more than 20 µm, for example. Each of the write wiring traces W1, W2 and the read wiring traces R1, R2 preferably has the thickness of not less than 8 µm and not more than 50 µm.

In this case, as described below, in the manufacturing process of the suspension board 1, the reflected light at the boundary surface 41*c* hardly influences the original pattern of the exposure light. Thus, the write wiring traces W1, W2 and the read wiring traces R1, R2 can be made finer while a deficiency is prevented from occurring at the write wiring traces W1, W2 and the read wiring traces R1, R2 that are formed using a photolithographic technique.

Next, a nickel film (not shown) having a thickness of not less than 0.05 µm and not more than 0.1 µm, for example, is formed on the write wiring traces W1, W2 and the read wiring traces R1, R2 by electroless plating of nickel. This nickel film is provided to improve adhesion of the write wiring traces W1, W2 and the read wiring traces R1, R2 with respect to the cover insulating layer 43 that is formed in the next process, and to prevent migration of copper.

Subsequently, the photosensitive polyimide resin precursor is applied on the nickel film and the base insulating layer 41, and exposure processing, heating processing, development processing and curing processing with heat are sequentially performed, whereby the cover insulating layer 43 made of polyimide is formed on the base insulating layer 41 and the nickel film as shown in FIG. 9(*b*). The cover insulating layer 43 has a thickness of not less than 2 µm and not more than 10

μm, for example. Thereafter, as shown in FIG. 10, the long-sized support substrate 10 is processed into a predetermined shape by etching, for example, whereby the suspension board 1 is completed.

(3) Remaining Etching Resist Portion

Figure 11:
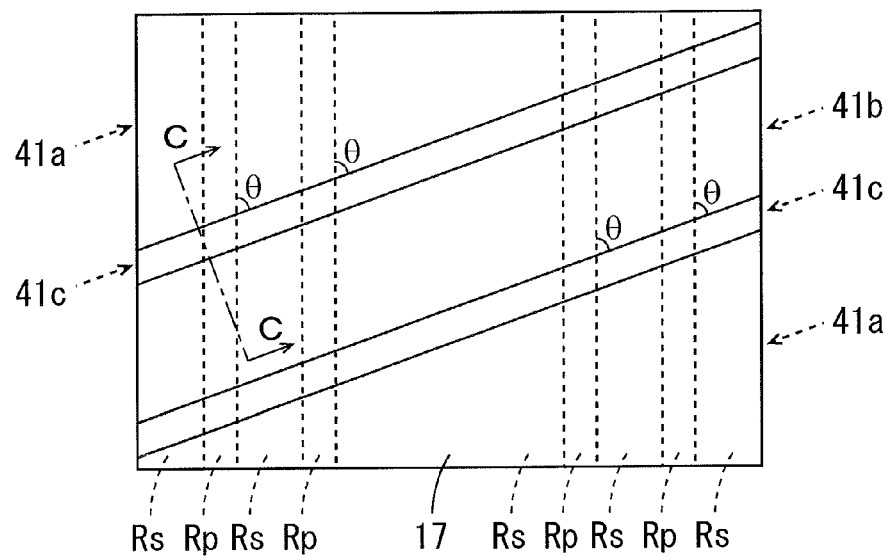
FIGS. 11(a) to 11(c) are diagrams showing part of the suspension board in the process for manufacturing.
Figure 11:
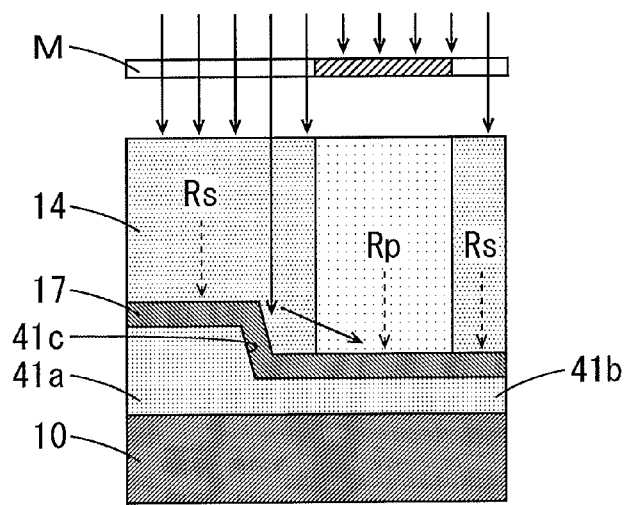
Figure 11:
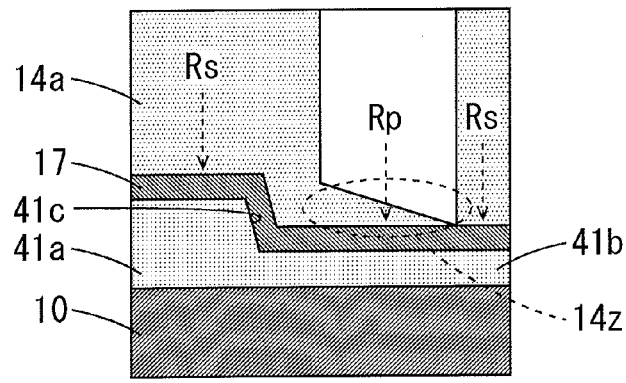

FIGS. 11(a) to 11(c) are diagrams showing part of the suspension board 1 in the process for manufacturing. FIG. 11(a) is a plan view of part of the suspension board 1 in the process of FIG. 6(a). FIG. 11(b) is a cross sectional view taken along the line C-C of FIG. 11(a) in the process of FIG. 7(a). FIG. 11(c) is a cross sectional view taken along the line C-C of FIG. 11(a) in the process of FIG. 7(b).

As shown in FIG. 11(a), in the process of FIG. 6(a), the seed layer 17 is formed on the thick portion 41a, the thin portion 41b and the boundary surface 41c of the base insulating layer 41. A region on the seed layer 17 in which the write wiring traces W1, W2 or the read wiring traces R1, R2 are formed in the subsequent process is referred to as a pattern formation region Rp. On the other hand, a region in which the write wiring traces W1, W2 and the read wiring traces R1, R2 are not formed in the subsequent process is referred to as a pattern non-formation region Rs. In FIG. 11(a), the pattern formation region Rp and the pattern non-formation region Rs are indicated by the dotted line.

As shown in FIG. 11(b), in the process of FIG. 7(a), the resist film 14 on the seed layer 17 is irradiated with the exposure light through the mask M. In the present example, the mask M has the same shape as the write wiring traces W1, W2 and the read wiring traces R1, R2. Because the exposure light is shielded by such a mask M, a portion of the resist film 14 that overlaps with the pattern non-formation region Rs is directly irradiated with the exposure light, and a portion of the resist film 14 that overlaps with the pattern formation region Rp is not directly irradiated with the exposure light.

However, in the pattern non-formation region Rs, the exposure light is reflected at a portion of the seed layer 17 on the boundary surface 41c of the base insulating layer 41, whereby a portion of the resist film 14 that overlaps with the pattern formation region Rp may be indirectly irradiated with the exposure light. In this case, as shown in FIG. 11(c), in the process of FIG. 7(b), part of the etching resist pattern 14a is formed on the pattern formation region Rp. A portion of the etching resist pattern 14a on such a pattern formation region Rp is referred to as a remaining etching resist portion 14z.

FIGS. 12(a) and 12(b) are sectional views for use in illustrating steps in a method of manufacturing the suspension board 1 when an intersection angle θ is set to 45°. FIGS. 12(a) and 12(b) respectively show a plan view and a perspective view of part of the suspension board 1 in the process of FIG. 6(a). As shown in FIGS. 12(a) and 12(b), when the intersection angle θ is 45°, the exposure light is reflected at a portion of the seed layer 17 on the boundary surface 41c of the base insulating layer 41 in the pattern non-formation region Rs, whereby the remaining etching resist portion 14z (see FIG. 11(c)) is formed in the pattern formation region Rp surrounded by the one-dot chain line.

The copper plating layer 15 is not formed in the subsequent process of FIGS. 8(a) and 8(b) on the pattern formation region Rp in which the remaining etching resist portion 14z is present. Therefore, a disconnection occurs at the write wiring traces W1, W2 and the read wiring traces R1, R2.

Figure 13:
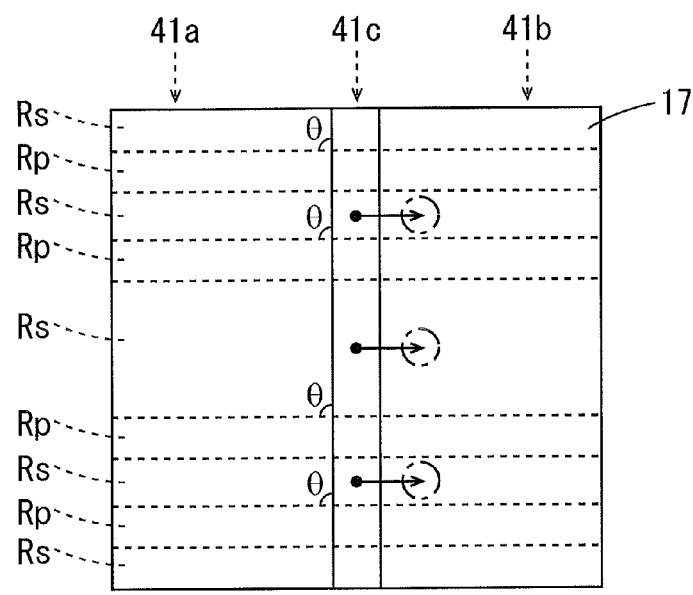
FIGS. 13(a) and 13(b) are sectional views for use in illustrating steps in a method of manufacturing the suspension board when the intersection angle is set to 90°.
Figure 13:
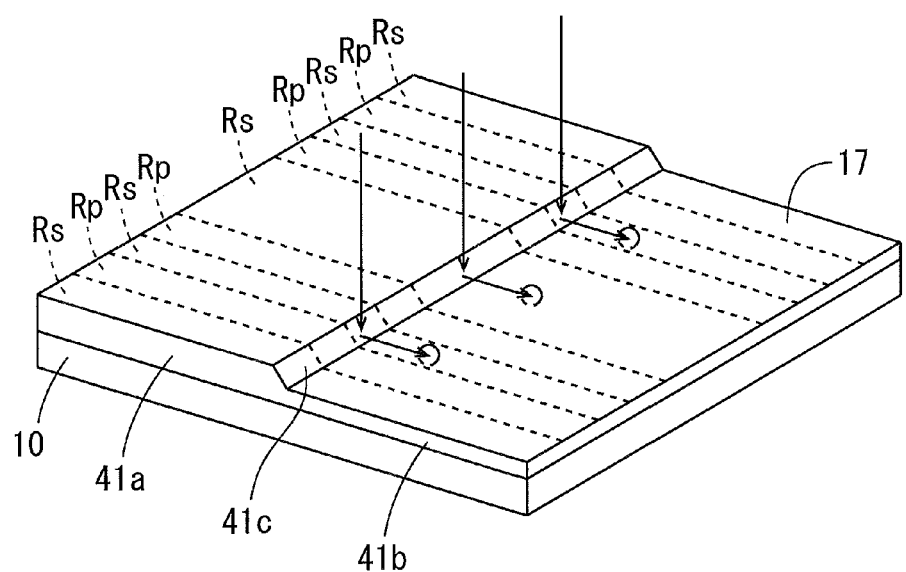

FIGS. 13(a) and 13(b) are sectional views for use in illustrating steps in a method of manufacturing the suspension board 1 when the intersection angle θ is set to 90°. FIGS. 13(a) and 13(b) respectively show a plan view and a perspective view of part of the suspension board 1 in the process of FIG. 6(a). As shown in FIGS. 13(a) and 13(b), when the intersection angle θ is 90°, even if the exposure light is reflected at a portion of the seed layer 17 on the boundary surface 41c of the base insulating layer 41 in the pattern non-formation region Rs, the pattern formation region Rp is not irradiated with the reflected exposure light. Therefore, the remaining etching resist portion 14z is not formed in the pattern formation region Rp. Thus, a disconnection can be prevented from occurring at the write wiring traces W1, W2 or the read wiring traces R1, R2.

(4) First Modified Example

While the photosensitive polyimide resin precursor 41p on the support substrate 10 is irradiated with ultraviolet rays through a mask having a predetermined gray scale such that the base insulating layer 41 that includes the thick portion 41a and the thin portion 41b is formed on the support substrate 10 in the above-mentioned embodiment, the invention is not limited to this. The base insulating layer 41 that includes the thick portion 41a and the thin portion 41b may be formed using another method as the below-mentioned example.

Figure 14:
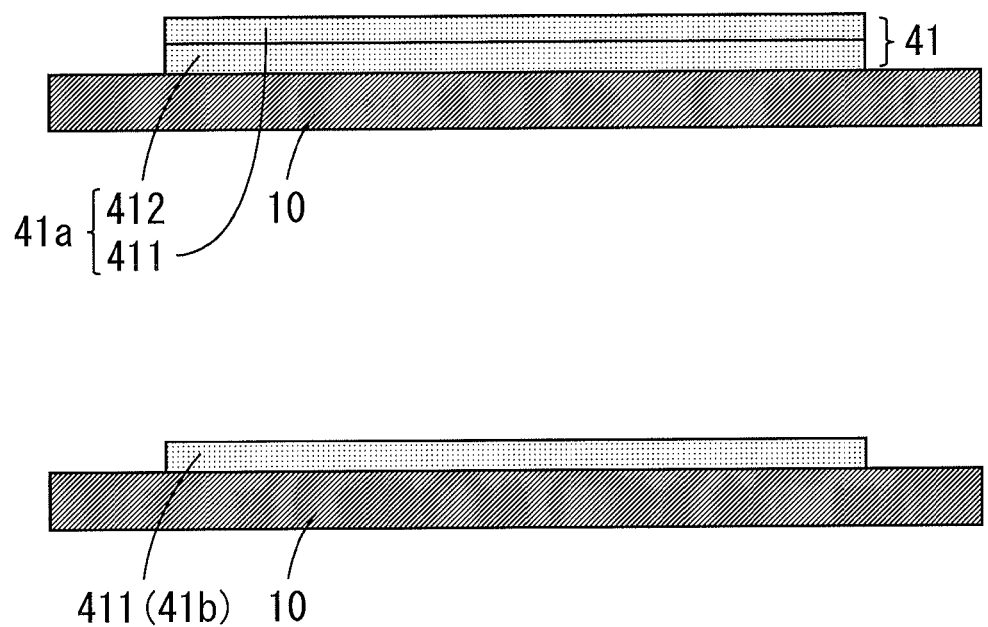
FIG. 14 is a cross sectional view of a support substrate and a base insulating layer of the suspension board according to a first modified example.

FIG. 14 is a cross sectional view of the support substrate 10 and the base insulating layer 41 of the suspension board 1 according to the first modified example. The upper diagram in FIG. 14 corresponds to a cross sectional view taken along the line A-A of the suspension board 1 of FIG. 1, and the lower diagram in FIG. 14 corresponds to a cross sectional view taken along the line B-B of the suspension board 1 of FIG. 1.

In the example of FIG. 14, a lower insulating layer 411 having the same thickness as the thin portion 41b of FIG. 5(b) is formed on the support substrate 10. An upper insulating layer 412 is partially formed on the lower insulating layer 411. In this case, the base insulating layer 41 is formed by the lower insulating layer 411 and the upper insulating layer 412. A laminated portion of the lower insulating layer 411 and the upper insulating layer 412 becomes the thick portion 41a, and the lower insulating layer 411 on which the upper insulating layer 412 is not laminated becomes the thin portion 41b.

According to the method for manufacturing this suspension board 1, it is possible to easily form the thick portion 41a and the thin portion 41b at the base insulating layer 41 by sequentially forming the lower insulating layer 411 and the upper insulating layer 412 on the support substrate 10.

Alternatively, a two-layer base material made of the support substrate 10 and the insulating layer may be prepared and an insulating layer made of the two-layer base material may be processed by half-etching or the like, whereby the base insulating layer 41 that includes the thick portion 41a and the thin portion 41b is formed on the support substrate 10.

(5) Second Modified Example

In the above-mentioned embodiment, the plurality of thin portions 41b are provided at the base insulating layer 41 such that the thick portion 41a and the thin portion 41b are alternately arranged. In this case, flexibility, at a specific portion in a direction in which the write wiring traces W1, W2 and the read wiring traces R1, R2 of the suspension board 1 extend, can be improved, and rigidity of the suspension board 1 can be controlled. Thus, a posture angle of the suspension board 1 can be adjusted with a high degree of accuracy in a direction in which the write wiring traces W1, W2 and the read wiring traces R1, R2 extend.

Figure 15:
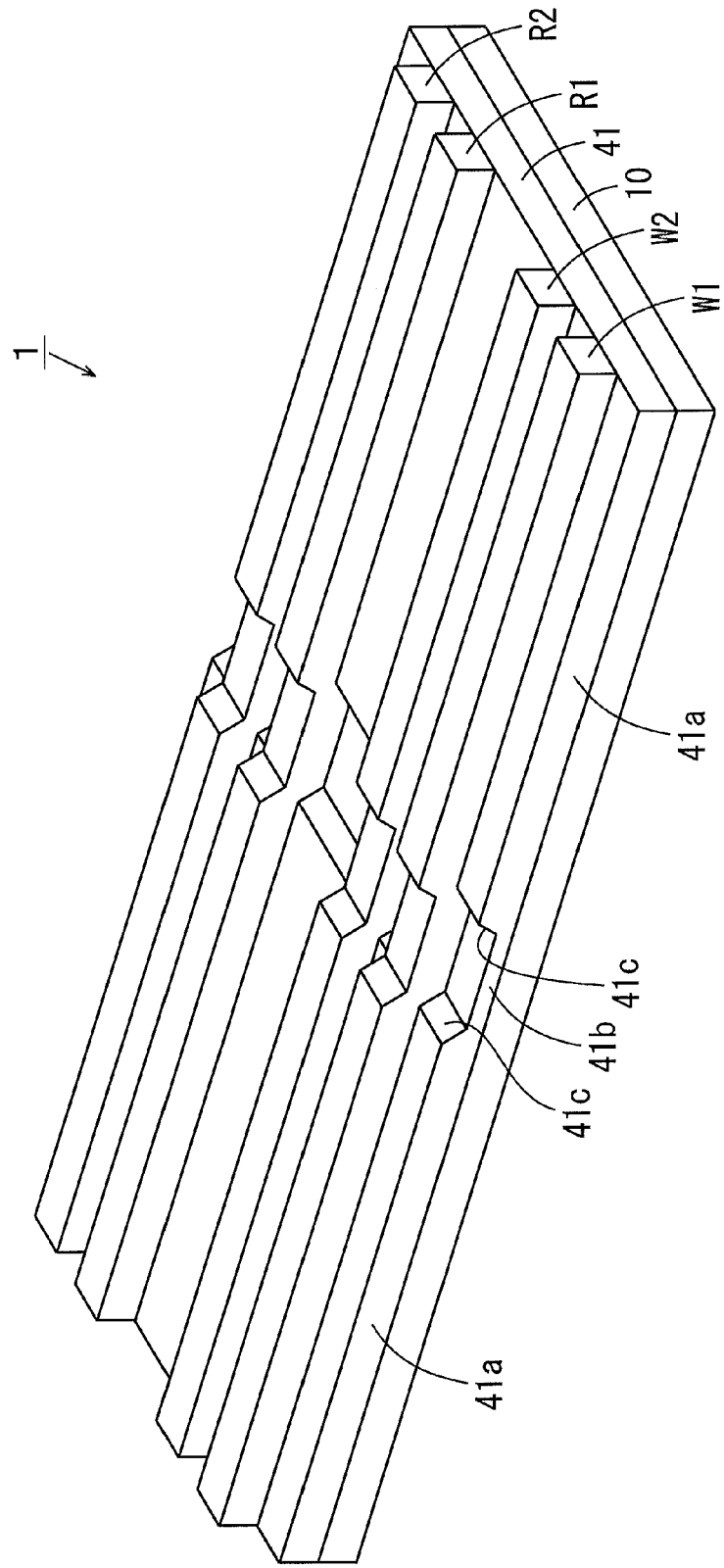
FIG. 15 is a schematic perspective view of part of the suspension board according to a second modified example.

Instead, as described in the below-mentioned example, the one thin portion 41b may be provided at the base insulating layer 41. FIG. 15 is a schematic perspective view of part of the suspension board 1 according to the second modified example. Similarly to FIG. 3, the cover insulating layer 43 is not shown in FIG. 15. As shown in FIG. 15, in the suspension board 1 according to the second modified example, the one thin portion 41b is provided at the base insulating layer 41 to be sandwiched by the two thick portions 41a.

Even in this case, flexibility and rigidity of the suspension board 1 can be appropriately controlled. Thus, the PSA of the magnetic head loaded at the suspension board 1 can be adjusted with a high degree of accuracy.

(6) Effects

In the suspension board 1 according to the present embodiment, the thick portion 41a and the thin portion 41b are formed at the base insulating layer 41 on the conductive support substrate 10. Thus, flexibility at a specific portion of the suspension board 1 can be improved, and rigidity of the suspension board 1 can be controlled.

Further, the write wiring traces W1, W2 and the read wiring traces R1, R2 are formed at the base insulating layer 41 to form an angle of not less than 60° and not more than 90° with a boundary line between the thick portion 41a and the boundary surface 41c. In this case, the exposure light is reflected at the boundary surface 41c in a direction that forms a smaller angle with respect to a direction in which the write wiring traces W1, W2 and the read wiring traces R1, R2 extend. Therefore, the reflected light hardly influences the original pattern of the exposure light. Thus, a disconnection is prevented from occurring at the write wiring traces W1, W2 and the read wiring traces R1, R2 that are formed using the photolithographic technique.

As a result, the posture angle of the suspension board 1 can be adjusted with a high degree of accuracy while reliability of the write wiring traces W1, W2 and the read wiring traces R1, R2 is ensured.

Further, when the thick portion 41a and thin portion 41b are formed such that the boundary surface 41c forms an angle of 90° with the upper surface of the thin portion 41b of the base insulating layer 41, a process of forming the thick portion 41a and the thin portion 41b at the base insulating layer 41 becomes extremely complicated although the reflected light at the boundary surface 41c is reduced. Further, stress is easily concentrated in the vicinity of the boundary line between the thin portion 41b and the boundary surface 41c at the time of bending.

In contrast, because the configuration of the present invention causes the reflected light at the boundary surface 41c to hardly influence the original pattern of the exposure light, even in a case in which the boundary surface 41c is inclined with respect to the upper surface of the thin portion 41b, a deficiency due to the reflected light is prevented from occurring at the write wiring traces W1, W2 and the read wiring traces R1, R2 that are formed using the photolithographic technique. Therefore, the boundary surface 41c is inclined with respect to the upper surface of the thin portion 41b, whereby the thick portion 41a and the thin portion 41b can be easily formed at the base insulating layer 41, and concentration of stress applied in the vicinity of the boundary line between the boundary surface 41c and the thin portion 41b can be retrieved.

(7) Other Embodiments

While the resist film 14 has negative photosensitivity in the above-mentioned embodiment, the invention is not limited to this. The resist film 14 may have positive photosensitivity.

When the resist film 14 has the positive photosensitivity in the example of FIGS. 12(a) and 12(b), the exposure light is reflected at a portion of the seed layer 17 on the boundary surface 41c of the base insulating layer 41 in the pattern formation region Rp, whereby the remaining etching resist portion 14z (see FIG. 11(c)) is formed in the pattern non-formation region Rs. The copper plating layer 15 is formed in the following process on the pattern non-formation region Rs in which the remaining etching resist portion 14z is present. Therefore, a short-circuit may occur between the write wiring traces W1, W2 or between the read wiring traces R1, R2.

On the other hand, when the resist film 14 has the positive photosensitivity in the example of FIGS. 13(a) and 13(b), even if the exposure light is reflected at a portion of the seed layer 17 on the boundary surface 41c of the base insulating layer 41 in the pattern formation region Rp, the pattern non-formation region Rs is not irradiated with the reflected exposure light. Therefore, the remaining etching resist portion 14z is not formed in the pattern non-formation region Rs. Thus, a short-circuit can be prevented from occurring between the write wiring traces W1, W2 or between the read wiring traces R1, R2.

(8) Inventive Examples

The below-mentioned suspension board 1 was fabricated based on the above-mentioned embodiment as the inventive examples 1 to 4 and the comparative examples 1 to 3. FIGS. 16(a) to 16(d) are plan views showing part of the suspension board 1 according to the inventive examples 1 to 4. FIGS. 17(a) to 17(c) are plan views showing part of the suspension board 1 according to the comparative examples 1 to 3. In FIGS. 16(a) to 16(d) and 17(a) to 17(c), the cover insulating layer 43 is not shown.

As shown in FIG. 16(a), an intersection angle θ of the suspension board 1 according to the inventive example 1 is 90°. As shown in FIG. 16(b), the intersection angle θ of the suspension board 1 according to the inventive example 2 is 80°. As shown in FIG. 16(c), the intersection angle of the suspension board 1 according to the inventive example 3 is 70°. As shown in FIG. 16(d), the intersection angle θ of the suspension board 1 according to the inventive example 4 is 60°.

As shown in FIG. 17(a), the intersection angle θ of the suspension board 1 according to the comparative example 1 is 50°. As shown in FIG. 17(b), the intersection angle θ of the suspension board 1 according to the comparative example 2 is 40°. As shown in FIG. 17(c), the intersection angle θ of the suspension board 1 according to the comparative example 3 is 30°.

In each of the suspension boards 1 of the inventive examples 1 to 4 and the comparative examples 1 to 3, whether or not a disconnection portion has occurred at the write wiring traces W1, W2 and the read wiring traces R1, R2 was inspected. The inspection results are shown in table 1.

TABLE 1

| INTERSECTION ANGLE θ | PRESENCE OF DISCONNECTION PORTION |
| --- | --- |
| 90° | NO |
| 80° | NO |
| 70° | NO |
| 60° | NO |
| 50° | YES |
| 40° | YES |
| 30° | YES |

As shown in table 1, in the suspension board 1 according to the inventive examples 1 to 4, a disconnection portion did not occur at the write wiring traces W1, W2 and the read wiring traces R1, R2. In particular, in the suspension board 1 according to the inventive example 1, the write wiring traces R1, R2 having the uniform width over the pattern formation region Rp were formed. On the other hand, in the suspension board 1 according to the comparative examples 1 to 3, disconnection portions have occurred at the write wiring traces W1, W2 or the read wiring traces R1, R2.

From the results of the above-mentioned inventive examples 1 to 4 and the comparative examples 1 to 3, it was found that when the intersection angle θ of the suspension board 1 is set to not less than 60° and not more than 90°, a disconnection portion is prevented from occurring at the write wiring traces W1, W2 and the read wiring traces R1, R2.

In particular, when the intersection angle is 90°, in the process of forming the write wiring traces W1, W2 and the read wiring traces R1, R2 on the base insulating layer 41, the exposure light is reflected at the boundary surface 41c in a direction substantially horizontal to a direction in which the write wiring traces W1, W2 and the read wiring traces R1, R2 extend. Therefore, the reflected light at the boundary surface 41c does not influence the original pattern of the exposure light. Thus, a deficiency such as a disconnection or a short-circuit is sufficiently prevented from occurring at the write wiring traces W1, W2 and the read wiring traces R1, R2 that are formed using a photolithographic technique. As a result, it was found that non-uniformity of the width of the write wiring traces W1, W2 and the read wiring traces R1, R2 can be prevented.

(9) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

The support substrate 10 is an example of a support substrate, the thick portion 41a is an example of a first portion, the thin portion 41b is an example of a second portion, the boundary surface 41c is an example of a boundary surface and the base insulating layer 41 is an example of an insulating layer. The lower insulating layer 411 is an example of a lower insulating layer, the upper insulating layer 412 is an example of an upper insulating layer and the write wiring trace W1, W2 or the read wiring trace R1, R2 are examples of a wiring trace. The suspension board 1 is an example of a suspension board with circuits, the resist film 14 is an example of a resist film and the etching resist pattern 14a is an example of a resist pattern.

As each of constituent elements recited in the claims, various other elements having configurations or functions described in the claims can be also used.

INDUSTRIAL APPLICABILITY

The present invention can be effectively utilized for various electric apparatuses that include suspension boards with circuits.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A suspension board with circuits, comprising:
a support substrate formed of a conductive material;
an insulating layer that is formed on the support substrate, and includes a plurality of first portions, each having a first thickness and at least one second portion, each having a second thickness smaller than the first thickness; and
a wiring trace formed to extend on the plurality of first portions and the at least one second portion of the insulating layer; wherein
a boundary surface is formed between an upper surface of each of the plurality of first portions and an upper surface of each of the at least one second portion, a boundary line between the upper surface of each of the plurality of first portions and the boundary surface extends in a first direction, and a lateral side of the wiring trace extends in a second direction that intersects with the first direction,
the wiring trace being formed on an upper surface of the insulating layer such that the second direction forms an angle of not less than 60 degrees and not more than 90 degrees with the first direction,
the insulating layer alternately including the plurality of first portions and the at least second portion in the second direction, and
wherein the plurality of first portions and the at least one second portion include a common, uniform, and flat lower surface.

2. The suspension board with circuits according to claim 1, wherein
the wiring trace is formed on the upper surface of the insulating layer such that the second direction forms an angle of 90 degrees with the first direction.

3. The suspension board with circuits according to claim 1, wherein the boundary surface is inclined by an angle larger than 0 degree and smaller than 90 degrees with respect to the upper surface of each of the at least one second portion of the insulating layer.

4. The suspension board with circuits according to claim 1, wherein each of the first portions has a thickness of not less than 3 μm and not more than 20 μm, and the second portion has a thickness of not less than 2 μm and not more than 15 μm.

5. The suspension board with circuits according to claim 1, wherein the insulating layer includes
a lower insulating layer that is formed on the support substrate, and has the second thickness and
an upper insulating layer formed in a partial region of an upper surface of the lower insulating layer, and
a portion of the lower insulating layer in the partial region and the upper insulating layer form the plurality of first portions, and
a portion of the lower insulating layer in a region except for the partial region forms the at least one second portion of the insulating layer.

6. A suspension board with circuits, comprising:
a support substrate formed of a conductive material;
an insulating layer formed on the support substrate, and including first and second portions, each having a first thickness and a third portion having a second thickness smaller than the first thickness; and
a wiring trace formed to extend on the first, second, and third portions of the insulating layer, wherein
a first boundary surface is formed between an upper surface of the first portion and an upper surface of the third portion, a boundary line between the upper surface of the first portion and the first boundary surface extends in a first direction, a second boundary surface is formed between an upper surface of the second portion and the upper surface of the third portion, a boundary line between the upper surface of the second portion and the second boundary surface extends in the first direction, and a lateral side of the wiring trace extends in a second direction that intersects with the first direction, the wiring trace is formed on an upper surface of the insulating layer such that the second direction forms an angle of not less than 60 degrees and not more than 90 degrees with the first direction, the third portion of the insulating layer is arranged between the first portion and the second portion in the second direction, and a lower surface of the first portion, a lower surface of the second portion, and a lower surface of the third portion of the insulating layer are formed to be uniform and flat.

7. A method for manufacturing a suspension board with circuits, comprising the steps of:

preparing a base material that has a laminated structure of a conductive support substrate and an insulating layer;

forming a plurality of first portions, each having a first thickness and at least one second portion, each having a second thickness smaller than the first thickness by processing the insulating layer; and forming a wiring trace that extends on the plurality of first portions and the at least one second portion of the insulating layer, wherein a boundary surface is formed between an upper surface of each of the plurality of first portions and an upper portion of each of the at least one second portion, the step of forming the wiring trace includes forming the wiring trace on an upper surface of the insulating layer such that a boundary line between an upper surface of each of the plurality of first portions and the boundary surface extends in a first direction, a lateral side of the wiring trace extends in a second direction that intersects with the first direction, and the second direction forms an angle of not less than 60 degrees and not more than 90 degrees with the first direction, the insulating layer alternately including the plurality of first portions and the at least one second portion in the second direction, and wherein the plurality of first portions and the at least one second portion include a common, uniform, and flat lower surface.

8. The method for manufacturing the suspension board with circuits according to claim 7, wherein the step of forming the wiring trace on the plurality of first portions and the at least one second portion of the insulating layer includes:

forming a resist film on the insulating layer, irradiating the resist film with an exposure light having a predetermined pattern, forming a resist pattern by developing the resist film, forming the wiring trace in a region of the insulating layer except for the resist pattern, and removing the resist pattern.

9. The method for manufacturing the suspension board with circuits according to claim 8, wherein an accumulated amount of the exposure light with which the resist film is irradiated is not less than 50 mJ/cm$^2$ and not more than 1500 mJ/cm$^2$.

10. The method for manufacturing the suspension board with circuits according to claim 8, wherein a wavelength of the exposure light with which the resist film is irradiated is not less than 300 nm and not more than 450 nm.

\* \* \* \* \*